United States Patent
Kawamura et al.

(10) Patent No.: US 10,024,739 B2
(45) Date of Patent: Jul. 17, 2018

(54) PRESSING FORCE SENSOR

(71) Applicant: MURATA MANUFACTURING CO., LTD., Nagaokakyo-Shi, Kyoto-fu (JP)

(72) Inventors: Hideki Kawamura, Nagaokakyo (JP); Masamichi Ando, Nagaokakyo (JP)

(73) Assignee: MURATA MANUFACTURING CO., LTD., Nagaokakyo-Shi, Kyoto-Fu (JP)

(*) Notice: Subject to any disclaimer, the term of this patent is extended or adjusted under 35 U.S.C. 154(b) by 897 days.

(21) Appl. No.: 14/515,881

(22) Filed: Oct. 16, 2014

(65) Prior Publication Data
US 2015/0035411 A1    Feb. 5, 2015

Related U.S. Application Data (63) Continuation of application No. PCT/JP2013/061146, filed on Apr. 15, 2013.

(30) Foreign Application Priority Data

Apr. 17, 2012 (JP) .................... 2012-093525

(51) Int. Cl.
*H01L 41/053* (2006.01)
*G01L 1/16* (2006.01)
(Continued)

(52) U.S. Cl.
CPC .............. *G01L 1/16* (2013.01); *H01L 41/053* (2013.01); *H01L 41/0533* (2013.01);
(Continued)

(58) Field of Classification Search
CPC ..... G01L 1/16; H01L 41/053; H01L 41/0533; H01L 41/1132; H01L 41/1138; H01L 41/193
(Continued)

(56) References Cited

U.S. PATENT DOCUMENTS

| | | | | |
|---|---|---|---|---|
| 5,915,267 A | * | 6/1999 | Kim ...................... | G01R 29/22 73/1.15 |
| 2004/0181312 A1 | * | 9/2004 | Miura .................... | B25J 13/085 700/245 |

(Continued)

FOREIGN PATENT DOCUMENTS

| | | |
|---|---|---|
| EP | 1 481 874 A2 | 12/2004 |
| JP | 11-295161 | 10/1999 |

(Continued)

OTHER PUBLICATIONS

PCT/JP2013/061146 Written Opinion dated May 16, 2013.

*Primary Examiner* — Thomas Dougherty
*Assistant Examiner* — Karen B Addison
(74) *Attorney, Agent, or Firm* — Arent Fox LLP (57) ABSTRACT

A pressing force sensor that includes a flat membrane piezoelectric element and a support. The flat membrane piezoelectric element includes a piezoelectric sheet having a piezoelectric constant. A first electrode is formed on a first main surface of the piezoelectric sheet and a second electrode is formed on a second main surface thereof. Long directions of the first electrode and the second electrode and a uniaxial stretching direction of the piezoelectric sheet form an angle of 45°. An opening portion having an elliptical section is formed on the support. The flat membrane piezoelectric element abuts the opening portion of the support. The support and the flat membrane piezoelectric element are disposed such that the opening portion is included within an area of the second electrode.

20 Claims, 8 Drawing Sheets

(51) Int. Cl.
  *H01L 41/193* (2006.01)
  *B82Y 15/00* (2011.01)
  *H01L 41/113* (2006.01)

(52) U.S. Cl.
  CPC ........... *B82Y 15/00* (2013.01); *H01L 41/1132* (2013.01); *H01L 41/1138* (2013.01); *H01L 41/193* (2013.01); *Y10S 977/742* (2013.01); *Y10S 977/762* (2013.01); *Y10S 977/956* (2013.01)

(58) Field of Classification Search
  USPC ........... 310/330, 323.21, 338, 324, 365–367; 73/514.34
  See application file for complete search history.

(56) References Cited

U.S. PATENT DOCUMENTS

| | | |
|---|---|---|
| 2010/0264779 A1 | 10/2010 | Ono |
| 2011/0193363 A1 | 8/2011 | Nishiwaki |
| 2012/0075226 A1 | 3/2012 | Andoh |
| 2013/0057499 A1 | 3/2013 | Ando et al. |

FOREIGN PATENT DOCUMENTS

| | | |
|---|---|---|
| JP | 2000-275114 A | 10/2000 |
| JP | 2001-004656 A | 1/2001 |
| JP | 2001-352111 A | 12/2001 |
| JP | 2004-299045 A | 10/2004 |
| JP | 2008-045958 A | 2/2008 |
| JP | 2010-252509 A | 11/2010 |
| JP | 2011-163945 A | 8/2011 |
| JP | 2011-253517 A | 12/2011 |
| WO | WO-2010-143528 A1 | 12/2010 |

\* cited by examiner

PRESSING FORCE SENSOR

CROSS REFERENCE TO RELATED APPLICATIONS

The present application is a continuation of International application No. PCT/JP2013/061146, filed Apr. 15, 2013, which claims priority to Japanese Patent Application No. 2012-093525, filed Apr. 17, 2012, the entire contents of each of which are incorporated herein by reference.

FIELD OF THE INVENTION

The present invention relates to a pressing force sensor for detecting pressing force from an outside by using a flat membrane-shaped piezoelectric element.

BACKGROUND OF THE INVENTION

Conventionally, there are various pressing force sensors using a flat membrane-shaped piezoelectric element. Patent Document 1 describes a pressing force sensor having a flat membrane-shaped piezoelectric element formed on a main surface of a flexible substrate. Referring to the pressing force sensor described in the Patent Document 1, a piezoelectric crystalline thin film is formed on a whole surface of a flexible substrate having a square main surface. The flexible substrate is supported by a support so as to be placed at predetermined intervals with respect to a ground substrate disposed on a back side. The support is disposed to take a square shape in a planar view of the flexible substrate. Consequently, a central area on the main surface of the flexible substrate tends to be dented by pressing force applied in an orthogonal direction to the main surface and the pressing force is detected from voltage generated by the dent.

The piezoelectric crystalline thin film described in the Patent Document 1 is formed of composite oxide containing metal as a main component. For this reason, the piezoelectric crystalline thin film is fragile to external force or predetermined detection sensitivity cannot be obtained depending on a formation state thereof in some cases.

For a piezoelectric element which overcomes defects caused by the piezoelectric crystalline thin film due to the composite oxide containing metal as a main component, it is supposed to use a piezoelectric sheet containing polylactic acid as a main component. It is known that a flat membrane-shaped piezoelectric element using the piezoelectric sheet containing the polylactic acid as the main component is excellent in flexibility and sufficient voltage can be obtained for detecting pressing force. Moreover, the piezoelectric sheet containing the polylactic acid as the main component is extended wholly by the pressing force. Referring to the piezoelectric sheet containing the lactic acid as the main component, accordingly, it is possible to detect, as distortion of the piezoelectric film, the extension as well as the dent of the piezoelectric sheet. Therefore, it is possible to detect the pressing force more efficiently as compared with the piezoelectric sheet disclosed in the Patent Document 1.

The piezoelectric sheet containing the polylactic acid has a piezoelectric constant d14. The flat membrane-shaped piezoelectric element using the piezoelectric sheet obtains detection voltage by utilizing piezoelectricity caused by the piezoelectric constant d14.

Patent Document 1: Japanese Unexamined Patent Publication No. 2000-275114

SUMMARY OF THE INVENTION

In the case in which the detection voltage is obtained by utilizing the piezoelectric constant d14, however, an electric charge generated in the piezoelectric sheet is offset by an electrode formed on both main surfaces of the piezoelectric sheet depending on a fixing structure of the piezoelectric sheet. Consequently, it is known that the detection voltage is reduced. In other words, the detection sensitivity to the pressing force is reduced in some cases.

It is an object of the present invention to provide a pressing force sensor capable of detecting pressing force without reducing the detection sensitivity even though the piezoelectric sheet having the piezoelectric constant d14 is used.

The pressing force sensor of the present invention includes a flat membrane type piezoelectric element including a piezoelectric sheet to be a flat membrane having a first main surface and a second main surface which are opposed to each other, a first electrode formed on the first main surface, and a second electrode formed on the second main surface; and a support including a third main surface abutting on the second main surface side of the flat membrane type piezoelectric element. The support includes, on the third main surface side, a space portion for permitting deformation of at least a part of the second electrode. The flat membrane type piezoelectric element and the support are disposed in such a manner that distortion caused by external force to the piezoelectric sheet over the space portion differs in two directions which are almost orthogonal to each other in the third main surface.

With this structure, when a range of the piezoelectric sheet which is opposed to the space portion is displaced by push-in of an operator or the like, it is distorted. In this case, amounts of distortion of the piezoelectric sheet are different from each other in the two orthogonal directions. Therefore, it is possible to prevent electric charges from being offset by the distortion in each of the directions. Consequently, it is possible to raise detection voltage generated by the displacement of the piezoelectric sheet. Thus, detection sensitivity to the displacement can be enhanced.

In the pressing force sensor of the present invention, a shape seen on a plane of the space portion seen from the third main surface of the support preferably has different lengths in the two directions which are almost orthogonal to each other. It is possible to suggest a shape having different lengths in long and short directions as seen on a plane, for example, an elliptical shape, a rectangular shape, an oval shape or the like.

With this structure, the amounts of distortion of the piezoelectric sheet in the two orthogonal directions can easily be caused to be different from each other by the shape seen on a plane of the space portion in the support.

In the pressing force sensor of the present invention, the piezoelectric sheet preferably contains polylactic acid and is preferably stretched in at least a uniaxial direction that is different from the two directions which are almost orthogonal to each other.

With this structure, there is contained polylactic acid representing a specific material of the piezoelectric sheet and having a piezoelectric constant d14. The polylactic acid is a polymer and has flexibility. Differently from the piezoelectric crystalline thin film described above in the related art, therefore, the polylactic acid is broken with difficulty even if a great displacement is generated by pressing force applied from an outside. Moreover, the polylactic acid is not influenced by pyroelectricity. For this reason, it is possible to obtain detection voltage which is not influenced by a temperature change in an external environment and depends on only a displacement amount.

In the pressing force sensor of the present invention, the direction in which the piezoelectric sheet is uniaxially stretched preferably forms an angle of approximately 45° with respect to the two directions which are almost orthogonal to each other.

By disposing the polylactic acid having the piezoelectric constant d14 in the support as in the structure, it is possible to obtain detection voltage more efficiently with respect to the displacement caused by the push-in.

In the pressing force sensor of the present invention, the flat membrane type piezoelectric element is preferably fixed to only both ends in a long direction of the space portion of the support.

With this structure, a range of the piezoelectric sheet which corresponds to the space portion is extended in only the long direction by the push-in and is rarely extended in the short direction (an almost orthogonal direction to the long direction). Accordingly, a difference between amounts of extension (amounts of distortion) in the two directions, that is, the long direction and the short direction is made greater. Consequently, it is possible to obtain detection voltage more efficiently with respect to the displacement caused by the push-in.

In the pressing force sensor of the present invention, the space portion may be a dent having a predetermined depth from the third main surface side of the support.

In the pressing force sensor of the present invention, an elastic member is preferably disposed in the dent.

In the pressing force sensor of the present invention, the space portion is preferably opened on surfaces other than the third main surface in the support.

This structure represents a specific shape of the space portion. The space portion may be the dent which is concaved from the third main surface into the support. In case of the dent, particularly, the elastic member may be disposed in the dent. With this structure, it is possible to prevent the piezoelectric sheet from being deformed more greatly than a desire by strong push-in. Thus, it is possible to avoid breakage of the piezoelectric sheet. Moreover, the space portion may be a through hole penetrating the support. When at least a part of the space portion is opened outward so that the piezoelectric sheet enters the space portion with curving by the push-in, particularly, air in the space portion is discharged to an outside. Consequently, it is possible to obtain detection voltage depending on only a displacement amount without influence of air pressure in the space portion.

In the pressing force sensor of the present invention, plural sets of the first electrodes, the second electrodes and the space portions may be provided.

With this structure, it is possible to detect pressing force every set. In other words, pressing force in a plurality of places can be detected by a single pressing force sensor.

In the pressing force sensor of the present invention, a protective layer may be provided on the first main surface side of the piezoelectric sheet.

With this structure, a surface on an operation input side of the flat membrane-shaped piezoelectric element is protected.

In the pressing force sensor of the present invention, a push-in member for pushing in a range of the piezoelectric sheet opposed to the space portion may be provided on the first main surface side of the piezoelectric sheet.

With this structure, the space portion of the piezoelectric sheet is not reliably pushed in by an operating method of an operator but the push-in member. Consequently, it is possible to detect the operation of the operator more reliably.

According to the present invention, it is possible to detect pressing force without reducing detection sensitivity even though a piezoelectric sheet having a piezoelectric constant d14 is used.

DETAILED DESCRIPTION OF THE INVENTION

Figure 1:
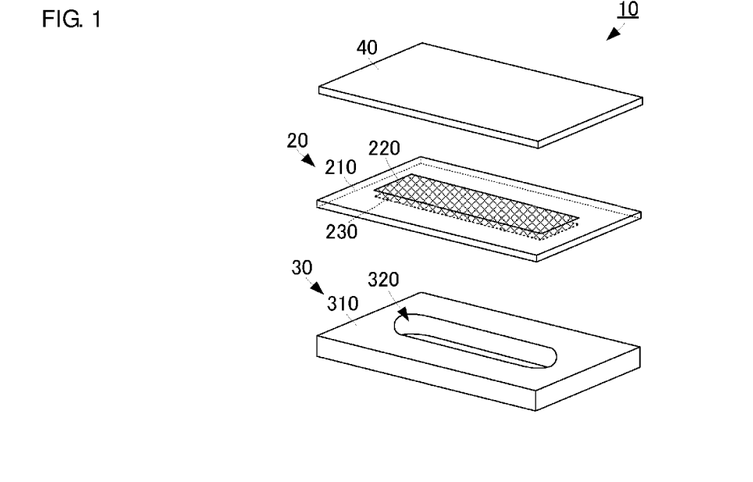
FIG. 1 is an exploded perspective view showing a pressing force sensor according to a first embodiment of the present invention.
Figure 2A:
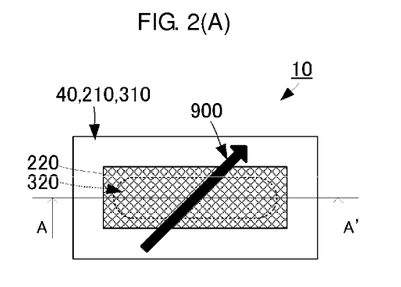
FIGS. 2(A) to 2(D) are a three-plan view showing the pressing force sensor and a sectional view taken along an A-A' surface according to the first embodiment of the present invention.
Figure 2B:
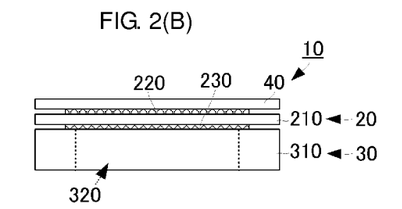
Figure 2C:
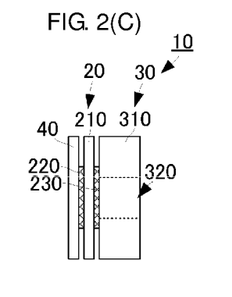
Figure 2D:
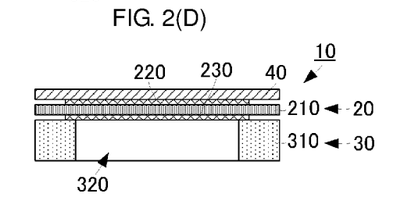

A pressing force sensor according to a first embodiment of the present invention will be described with reference to the drawings. FIG. 1 is an exploded perspective view showing the pressing force sensor according to the first embodiment of the present invention. FIG. 2(A) is a plan view showing the pressing force sensor according to the first embodiment of the present invention, FIG. 2(B) is a side view showing a long surface of the pressing force sensor, FIG. 2(C) is a side view showing a short surface of the pressing force sensor, and FIG. 2(D) is a sectional view showing an A-A' surface.

A pressing force sensor 10 includes a flat membrane type piezoelectric element 20, a support 30 and a protective layer 40. The flat membrane type piezoelectric element 20, the support 30 and the protective layer 40 take rectangular shapes seen on a plane (shapes seen from an operation surface side (a side of a surface to which pressing force is applied)) and are arranged in abutment on each other with respective main surfaces provided in parallel.

Figure 3A:
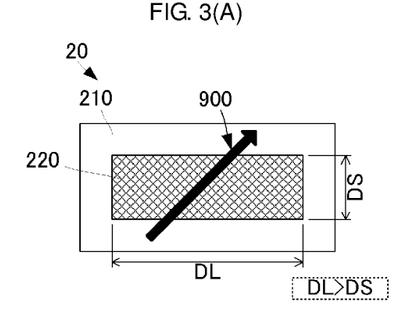
FIGS. 3(A) to 3(C) are a three-plan view showing a flat membrane type piezoelectric element of the pressing force sensor and a sectional view taken along the A-A' surface according to the first embodiment of the present invention.
Figure 3B:
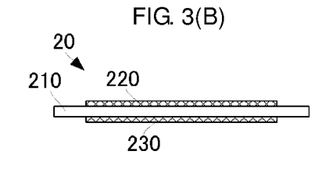
Figure 3C:
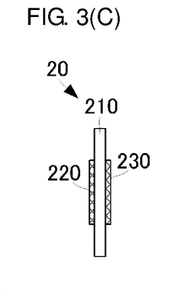

FIG. 3(A) is a plan view showing the flat membrane type piezoelectric element 20, FIG. 3(B) is a side view showing a long surface of the flat membrane type piezoelectric element 20, and FIG. 3(C) is a side view showing a short surface side of the flat membrane type piezoelectric element 20. The flat membrane type piezoelectric element 20 includes a piezoelectric sheet 210, a first electrode 220 and a second electrode 230.

The piezoelectric sheet 210 is formed by a flat membrane taking a rectangular shape. In other words, the piezoelectric sheet 210 is formed in a shape having two orthogonal directions seen on a plane, that is, a long direction and a short direction.

The piezoelectric sheet 210 is formed of L-polylactic acid (hereinafter referred to as PLLA). The piezoelectric sheet 210 may be formed of D-polylactic acid (hereinafter referred to as PDLA).

The PLLA to be used for the piezoelectric sheet 210 is a chiral polymer and a main chain has a spiral structure. The PLLA sheet has piezoelectricity when it is stretched in a uniaxial direction (a direction of a thick arrow 900 in the drawing) so that a molecule is oriented. A piezoelectric constant of the PLLA stretched in the uniaxial direction belongs to a very high class in polymers.

In the case in which the PLLA sheet is stretched in a biaxial direction, it is possible to obtain the same effects as those in the stretch in the uniaxial direction by causing stretch ratios of the respective axes to be different from each other. For example, in the case in which eightfold stretch is carried out in a certain direction that is set as an X axis and double stretch is carried out in a Y-axis direction that is orthogonal to the X axis, it is possible to obtain equivalent effects to those in the case in which approximately fourfold uniaxial stretching is carried out in an X-axis direction with respect to the piezoelectric constant. The uniaxial stretched film simply tends to be torn along a stretching axis direction. Therefore, it is possible to increase strength to some extent by carrying out the bidirectional stretching.

Moreover, the PLLA generates the piezoelectricity by only the stretching and polling processing does not need to be performed as in piezoelectric ceramics using the piezoelectric crystalline thin film in the description of the related art. In other words, the piezoelectricity of the PLLA which does not belong to a ferroelectrics is not expressed by ionic polarization as in the ferroelectrics such as PVDF or PZT but is derived from a spiral structure to be a characteristic structure of a molecule. For this reason, pyroelectricity generated in other ferroelectric piezoelectric substances is not generated in the PLLA. Furthermore, the PVDF or the like has a piezoelectric constant changed with time and the piezoelectric constant is remarkably reduced in some cases. However, the PLLA has a piezoelectric constant which is very stable with time.

By using the PLLA, thus, there is no influence of the pyroelectricity. Accordingly, it is possible to obtain detection voltage corresponding to only a displacement amount (pressing force) without depending on temperature of a detecting position in detection. Since the PLLA is a polymer and has flexibility, however, it is not broken due to a great displacement differently from piezoelectric ceramics. Even if the displacement amount is large, therefore, it can be detected reliably.

Moreover, the PLLA has a very low relative permittivity of approximately 2.5. For this reason, a piezoelectric output constant (=piezoelectric g constant, $g = d/\varepsilon_T$) has a great value wherein d represents a piezoelectric constant and $\varepsilon_T$ represents a dielectric constant.

A piezoelectric g constant of PVDF having a dielectric constant $\varepsilon_{33T}=13\times\varepsilon_0$ and a piezoelectric constant $d_{31}=25$ pC/N is $g_{31}=0.2172$ Vm/N in accordance with the equation as described above. On the other hand, $d_{14}=2\times d_{31}$ is obtained by conversion of the piezoelectric g constant of PLLA having a piezoelectric constant $d_{14}=10$ pC/N into $g_{31}$. Consequently, $d_{31}=5$ pC/N and the piezoelectric g constant of $g_{31}=0.2258$ Vm/N are obtained. Accordingly, it is possible to obtain the same sufficient sensor sensitivity as the PVDF with PLLA having a piezoelectric constant $d_{14}=10$ pC/N. The inventors of the present invention experimentally obtain PLLA having $d_{14}=15$ to 20 pC/N and implement a sensor having very high sensitivity by using the PLLA sheet.

The piezoelectric sheet 210 is formed with a uniaxial stretching direction (a direction in which it is finally stretched most greatly by the stretch processing as described above (the direction of the thick arrow 900 in the drawing)) having an angle of approximately 45° with respect to the long and short directions of the rectangle. The angle of the uniaxial stretching direction is not restricted to exact 45° but may be approximately 45°. The angle of approximately 45° includes approximately 45°±10°, for example. These angles are design items to be properly determined depending on a whole design such as detection precision in bending based on uses of a displacement sensor.

By taking the shape, the piezoelectric sheet 210 generates an electric charge for only the stretch (distortion) in the long direction and the stretch (distortion) in the short direction. The reason is that the PLLA configuring the piezoelectric sheet 210 has the piezoelectric constant d14.

Since the piezoelectric sheet 210 is a rectangular flat membrane, it has a first plane and a second plane which are opposed to each other in a thickness direction. The first electrode 220 is formed on a first main surface of the piezoelectric sheet 210. The second electrode 230 is formed on a second main surface of the piezoelectric sheet 210. The first electrode 220 and the second electrode 230 take rectangular shapes seen on a plane and are formed to cover a predetermined area of the piezoelectric sheet 210. Specifically, they are formed to cover at least an opening portion 320 of the support 30 which will be described below. The first electrode 220 and the second electrode 230 are formed opposite to each other.

For the first electrode 220 and the second electrode 230, it is suitable to use any of an organic electrode containing ITO, ZnO and polythiophene as main components, an organic electrode containing polyaniline as a main component, a silver nanowire electrode and a carbon nanotube electrode. By using these materials, it is possible to form an electrode pattern having high translucency. In the case in which the translucency is not required, it is also possible to use an electrode formed by silver paste or a metal-based electrode formed by vapor deposition, sputtering, plating or the like. The touch panel 10 is displaced greatly. Therefore, it is particularly suitable to use the organic electrode containing polythiophene having excellent bendability as a main component, the organic electrode containing polyaniline as a main component, the silver nanowire electrode, the carbon nanotube electrode and the metal-based electrode.

In the flat membrane-shaped piezoelectric element 20 taking the shape, when the piezoelectric sheet 210 is extended (distorted) in the long and short directions, electric charges corresponding to an amount of extension are generated so that detection voltage is generated between the first electrode 220 and the second electrode 230. By the detection voltage, it is possible to detect pressing force.

Figure 4A:
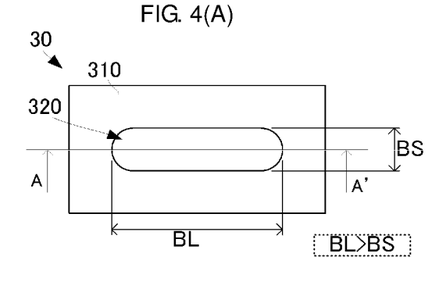
FIGS. 4(A) to 4(D) are a three-plan view showing a support of the pressing force sensor according to the first embodiment of the present invention.
Figure 4B:
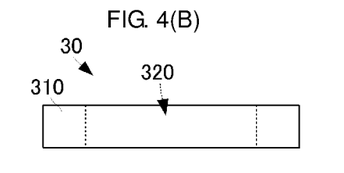
Figure 4C:
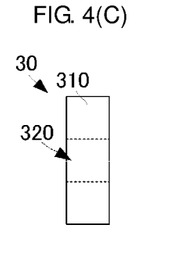
Figure 4D:
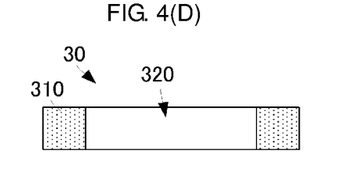

The support 30 includes a body 310 and the opening portion 320 formed on the body 310. FIG. 4(A) is a plan view showing the support 30, FIG. 4(B) is a side view showing a long surface of the support 30, FIG. 4(C) is a side view showing a short surface of the support 30, and FIG. 4(D) is a sectional view showing the support 30 taken along an A-A' surface.

The body 310 takes a rectangular shape extended in two orthogonal directions including a long direction and a short direction as seen on a plane. The body 310 is formed by an insulating substrate. A Young's modulus of body 310 is higher than that of the piezoelectric sheet 210. In other words, the body 310 is curved with more difficulty by external force than the piezoelectric sheet 210.

The body 310 has the opening portion 320 penetrating in a thickness direction which is perpendicular to a plane expanded in the two orthogonal directions. The opening portion 320 is formed on an almost center of the plane of the body 310. The opening portion 320 is formed to be long along the long direction of the body 310 and be short along the short direction of the body 310. In other words, a length BL in the long direction of the opening portion 320 is greater than a length BS in the short direction thereof (BL>BS). It is preferable that a ratio of the lengths should be approximately 2:1. The opening portion 320 takes an elliptical shape seen on a plane. However, the shape of the opening portion 320 seen on a plane is not restricted thereto. Although the opening portion 320 has a constant sectional area in the thickness direction in the present embodiment, moreover, it may be varied.

The flat membrane-shaped piezoelectric element 20 having the structure described above is disposed on one of the main surfaces (a third main surface) of the support 30. In this case, the second electrode 230 side of the flat membrane type piezoelectric element 20 is disposed to abut on the third main surface of the body 310 of the support 30. The support 30 and the flat membrane type piezoelectric element 20 are arranged with respective long directions set to be coincident with each other. The support 30 and the flat membrane type piezoelectric element 20 are fixed to each other in the abutting portion. A portion in which the second electrode 230 is opposed to the opening portion 320 corresponds to a "space portion" according to the present invention.

Furthermore, the flat membrane type piezoelectric element 20 and the support 30 are fixed to each other with an adhesive material or the like with a formation range of the second electrode 230 and that of the opening portion 320 overlapping each other as seen on a plane (as seen along an orthogonal direction to the first main surface, the second main surface and the third main surface). More specifically, the flat membrane type piezoelectric element 20 and the support 30 are fixed to each other with the formation range of the opening portion 320 included in that of the second electrode 230. To the contrary, the first electrode 220 and the second electrode 230 in the flat membrane type piezoelectric element 20 and the opening portion 320 of the support 30 are formed with the formation range of the second electrode 230 and that of the opening portion 320 overlapping each other or with the formation range of the opening portion 320 included in that of the second electrode 230.

The protective layer 40 is disposed on the first electrode 220 side of the flat membrane type piezoelectric element 20 in a composite including the support 30 and the flat membrane type piezoelectric element 20. In the same manner as the flat membrane type piezoelectric element 20 and the support 30, the protective layer 40 takes a rectangular shape seen on a plane. The protective layer 40 is formed by an insulating material having a lower Young's modulus than the piezoelectric sheet 210. In other words, the protective layer 40 is formed by a material which does not hinder the displacement of the piezoelectric sheet 210 by pressing force applied from an outside. Moreover, the protective layer 40 is fixed to the first electrode 220 side of the flat membrane type piezoelectric element 20 with an adhesive material or the like and a material which does not hinder the displacement of the piezoelectric sheet 210 is selected for the adhesive material or the like.

Figure 5A:
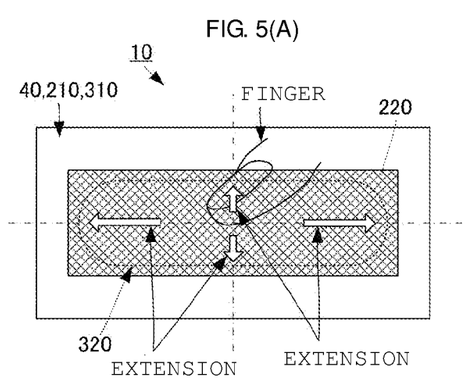
FIGS. 5(A) to 5(C) are views explaining a shape of the pressing force sensor in a push-in state and a concept of pressing force detection.
Figure 5B:
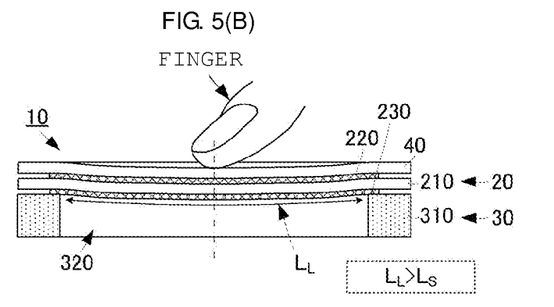
Figure 5C:
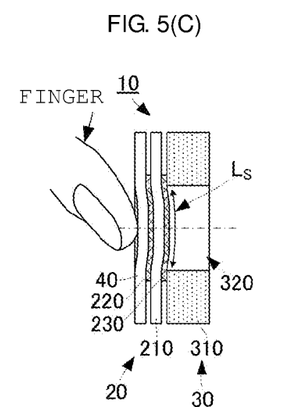

The pressing force sensor 10 taking the shape detects pressing force which pushes the range of the opening portion 320 in from the protective layer 40 side. FIGS. 5(A) to 5(C) are views explaining a shape of the pressing force sensor in a push-in state and a concept of pressing force detection. FIG. 5(A) is a plan view, FIG. 5(B) is a side view showing a long surface and FIG. 5(C) is a side view showing a short surface.

As shown in FIGS. 5(A) to 5(C), when a surface of the protective layer 40 (a surface at an opposite side to the flat membrane type piezoelectric element 20 side) is pushed in with a finger of an operator, the piezoelectric sheet 210 is also displaced together with the protective layer 40 by the push-in.

The piezoelectric sheet 210 (the flat membrane type piezoelectric element 20) is fixed to the support 30 except for a range in which the opening portion 320 and the second electrode 230 are opposed to each other, that is, a space portion. The uniaxial stretching direction of the piezoelectric sheet 210 forms an angle of 45° with respect to the long and short directions of the opening portion 320.

Accordingly, the flat membrane type piezoelectric element 20 generates detection voltage corresponding to displacement caused by distortion (extension) in the long direction and displacement caused by distortion (extension) in the short direction by the push-in as described above. The detection voltage has a value obtained by adding an electric charge generated by the displacement in the long direction and an electric charge generated by the displacement in the short direction.

In the opening portion 320, the length BL in the long direction is different from the length BS in the short direction as described above. As shown in FIGS. 5(B) and 5(C), accordingly, a displacement amount $L_L$ of the piezoelectric sheet 210 caused by the extension in the long direction is greater than a displacement amount $L_S$ of the piezoelectric sheet 210 caused by the extension in the short direction ($L_L$>$L_S$). For this reason, a proper difference is made between an amount of electric charges generated by the extension in the long direction and an amount of electric charges generated by the extension in the short direction. Consequently, desirable detection voltage corresponding to the push-in is generated from the flat membrane type piezoelectric element 20 so that the push-in can be detected.

Furthermore, the PLLA has an amount of generated electric charges varied almost linearly depending on the displacement amount. Accordingly, it is possible to detect an amount of push-in by measuring a detection voltage value. By using the amount of push-in, for example, it is also possible to change a volume adjusting speed depending on the amount of push-in or to vary fast-forwarding and rewinding speeds in the case in which the pressing force sensor 10 is utilized for a remote control device of a television device or a video recording/reproducing device.

In addition, the PLLA is not influenced by the pyroelectricity. Therefore, it is possible to accurately detect the amount of push-in without influence of temperature of an operator's finger.

As described above, it is possible to implement a pressing force sensor capable of using the structure according to the present embodiment and detecting the push-in and the amount of the push-in reliably and accurately. In this case, it is possible to implement the pressing force sensor with a simple structure.

Although an end on the third main surface side of the opening portion 320 makes a right angle in the above description, it is preferable to chamfer the end. In particular, it is more preferable to carry out round chamfering for curving with a predetermined curvature. By the chamfered shape, it is possible to prevent the second electrode 230 or the piezoelectric sheet 210 from being damaged or broken.

Figure 6:
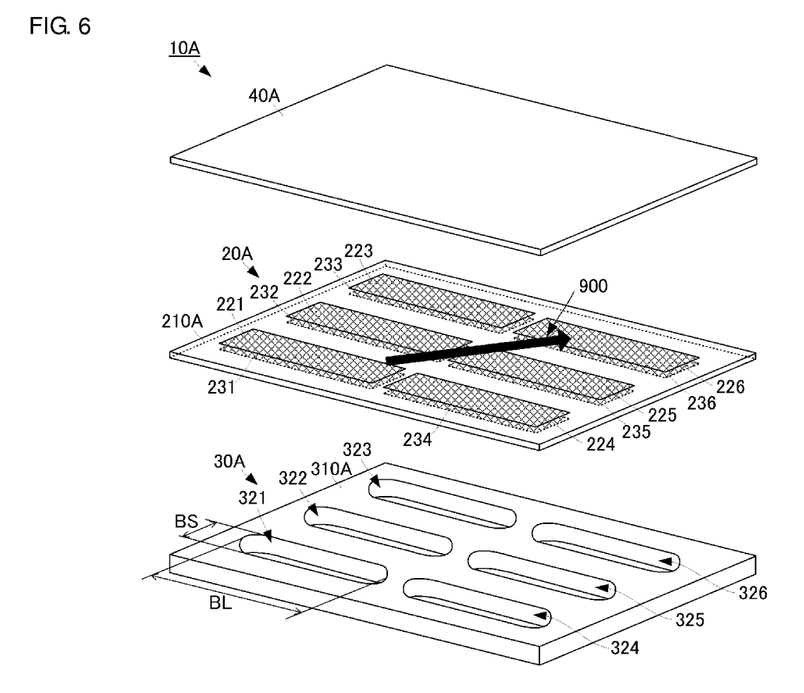
FIG. 6 is an exploded perspective view showing a pressing force sensor according to a second embodiment of the present invention.

Next, a pressing force sensor according to a second embodiment will be described with reference to the drawings. FIG. 6 is an exploded perspective view showing the pressing force sensor according to the second embodiment of the present invention.

A pressing force sensor 10A according to the present embodiment includes plural sets of an opening portion and first and second electrodes described in the first embodiment.

A flat membrane type piezoelectric element 20A includes a piezoelectric sheet 210A. The piezoelectric sheet 210A is formed by the same material as the piezoelectric sheet 210 and is stretched in a uniaxial direction. In the present embodiment, the piezoelectric sheet 210A is stretched in the uniaxial direction to form an angle of 45° with respect to long and short directions in the same manner as the piezoelectric sheet 210 according to the first embodiment.

A plurality of first electrodes 221, 222, 223, 224, 225 and 226 (hereinafter referred collectively to as 221 to 226) is formed on a first main surface of the piezoelectric sheet 210A. The plurality of first electrodes 221 to 226 take rectangular shapes. The plurality of first electrodes 221 to 226 are arranged with respective long directions made coincident with the long direction of the piezoelectric sheet 210A. The plurality of first electrodes 221, 222 and 223 are arranged at intervals along the short direction of the piezoelectric sheet 210A. The plurality of first electrodes 224, 225 and 226 are arranged at intervals along the short direction of the piezoelectric sheet 210A. The first electrodes 221 and 224 are arranged at intervals along the long direction. The first electrodes 222 and 225 are arranged at intervals along the long direction. The first electrodes 223 and 225 are arranged at intervals along the long direction. An arrangement pattern of the plurality of first electrodes 221 to 226 is not restricted thereto but can be set properly depending on a specification of the pressing force sensor 10A.

A plurality of second electrodes 231, 232, 233, 234, 235 and 236 are formed on a second main surface of the piezoelectric sheet 210A. The second electrode 231 is arranged in an opposed position to the first electrode 221 and the second electrode 232 is arranged in an opposed position to the first electrode 222. The second electrode 233 is arranged in an opposed position to the first electrode 223, and the second electrode 234 is arranged in an opposed position to the first electrode 224. The second electrode 235 is arranged in an opposed position to the first electrode 225, and the second electrode 236 is arranged in an opposed position to the first electrode 226.

A support 30A takes the same shape as the piezoelectric sheet 210A as seen on a plane. A plurality of opening portions 321, 322, 323, 324, 325 and 326 (hereinafter referred collectively to as 321 to 326) are formed on the support 30A with respect to a body 310A. The plurality of opening portions 321 to 326 take the same shape as the opening portion 320 described in the first embodiment and are configured from through holes penetrating the support 30A in an orthogonal direction to a third main surface of the support 30A on which the flat membrane type piezoelectric element 20A is disposed. The plurality of opening portions 321 to 326 take such an elliptical shape that a length in one of directions of an open surface is great and a length in the other direction which is orthogonal to the one direction is short. In other words, a length BL in a long direction of the plurality of opening portions 321 to 326 is greater than a length BS in a short direction (BL>BS). The plurality of opening portions 321 to 326 are formed to be long along the long direction of the body 310A and to be short along the short direction of the body 310A.

The plurality of opening portions 321 to 326 are arranged in a predetermined array pattern in the same manner as the first electrodes 221 to 226 and the second electrodes 231 to 236 described above. In this case, the opening portions 321 to 326 are formed in such a manner that the opening portion 321 is arranged within the range of the second electrode 231, the opening portion 322 is arranged within the range of the second electrode 232, the opening portion 323 is arranged within the range of the second electrode 233, the opening portion 324 is arranged within the range of the second electrode 234, the opening portion 325 is arranged within the range of the second electrode 235 and the opening portion 326 is arranged within the range of the second electrode 236 as seen in an orthogonal direction to a third main surface when the flat membrane type piezoelectric element 20A is disposed on the third main surface side of the support 30A.

A protective layer 40A is provided on the first electrodes 221 to 226 side of the flat membrane type piezoelectric element 20A. The protective layer 40A is formed by the same material as the protective layer 40 described in the first embodiment. The protective layer 40A takes the same shapes as the flat membrane type piezoelectric element 20A and the support 30A as seen on a plane.

The respective sets of the first electrodes and the second electrodes in the flat membrane type piezoelectric element 20A are connected to different detection circuits from each other.

By this structure, it is possible to detect pressing force on a plurality of different points by a single pressing force sensor. Consequently, a remote controller having a plurality of buttons can be formed by a single pressing force sensor.

Figure 7:
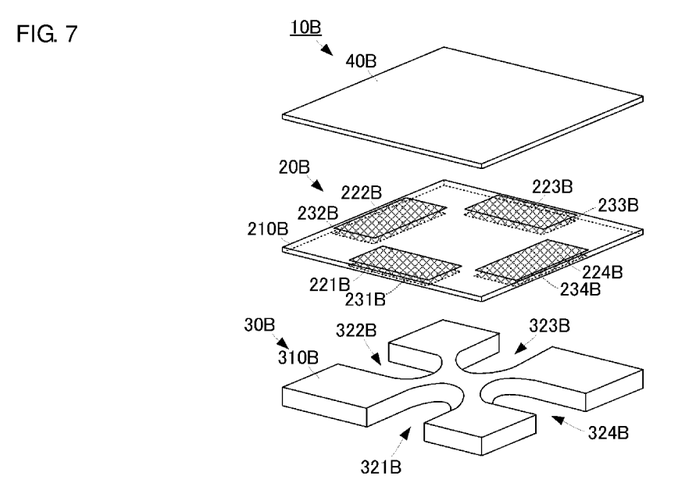
FIG. 7 is an exploded perspective view showing a pressing force sensor according to a third embodiment of the present invention.
Figure 8A:
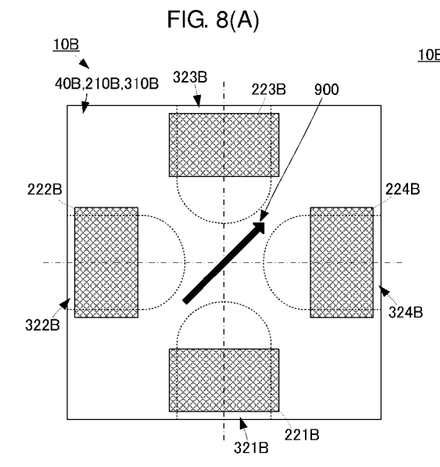
FIGS. 8(A) to 8(C) are a three-plan view showing the pressing force sensor according to the third embodiment of the present invention.
Figure 8B:
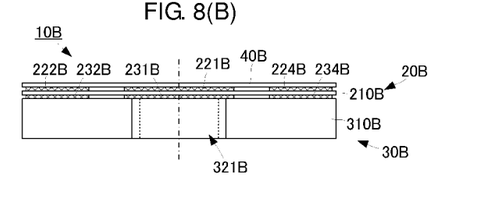
Figure 8C:
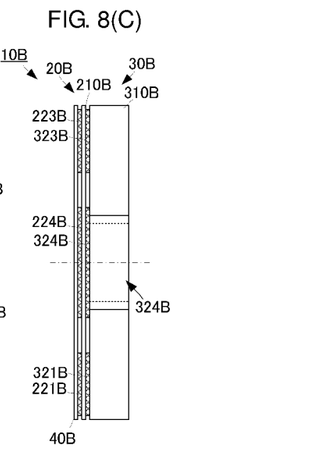

Next, a pressing force sensor according to a third embodiment will be described with reference to the drawings. FIG. 7 is an exploded perspective view showing the pressing force sensor according to the third embodiment of the present invention. FIG. 8(A) is a plan view showing the pressing force sensor according to the third embodiment of the present invention, FIG. 8(B) is a first side view showing the pressing force sensor and FIG. 8(C) is a second side view showing the pressing force sensor.

A pressing force sensor 10B includes a flat membrane type piezoelectric element 20B, a support 30B and a protective layer 40B. The flat membrane type piezoelectric element 20B includes a piezoelectric sheet 210B, first electrodes 221B, 222B, 223B and 224B and second electrodes 231B, 232B, 233B and 234B. The piezoelectric sheet 210B is formed by the same material as the piezoelectric sheet 210 described in the first embodiment. The piezoelectric sheet 210B takes a rectangular shape seen on a plane. In particular, the piezoelectric sheet 210B according to the present embodiment takes a square shape seen on a plane.

The first electrodes 221B, 222B, 223B and 224B are provided on a first main surface of the piezoelectric sheet 210B. The first electrodes 221B, 222B, 223B and 224B take rectangular shapes seen on a plane. The first electrodes 221B, 222B, 223B and 224B are formed by the same material as the first electrode 220 described in the first embodiment. The first electrodes 221B, 222B, 223B and 224B are disposed in the vicinity of respective sides of the first main surface in the piezoelectric sheet 210B. In this case, the first electrodes 221B, 222B, 223B and 224B are arranged with respective long directions in parallel to sides along them.

The second electrodes 231B, 232B, 233B and 234B are provided on a second main surface of the piezoelectric sheet 210B. The second electrodes 231B, 232B, 233B and 234B take rectangular shapes seen on a plane. The second electrode 231B is disposed in an opposed position to the first electrode 221B. The second electrode 232B is disposed in an opposed position to the first electrode 222B. The second electrode 233B is disposed in an opposed position to the first electrode 223B. The second electrode 234B is disposed in an opposed position to the first electrode 224B.

A support 30B is provided on the second main surface side of the flat membrane type piezoelectric element 20B. The support 30B is formed by the same material as the support 30 described in the first embodiment. The support 30B takes a rectangular shape seen on a plane. In particular, the support 30B according to the present embodiment is the same as the piezoelectric sheet 210B and takes a square shape seen on a plane.

Opening portions 321B, 322B, 323B and 324B penetrating a body 310B of the support 30B are formed on the support 30B in an orthogonal direction to a third main surface abutting on the flat membrane type piezoelectric element 20B. The plurality of opening portions 321B, 322B, 323B and 324B are formed in the vicinity of respective sides as seen in the orthogonal direction to the third main surface of the support 30B. In this case, the opening portion 321B is formed in a partial overlapping position with the second electrode 231B as seen in the orthogonal direction to the third main surface with the second main surface of the flat membrane type piezoelectric element 20B abutting on the third main surface of the support 30B. Similarly, the opening portions 322B, 323B and 324B are formed in partial overlapping positions with the second electrodes 232B, 233B and 234B as seen in the orthogonal direction to the third main surface with the second main surface of the flat membrane type piezoelectric element 20B abutting on the third main surface of the support 30B, respectively.

The plurality of opening portions 321B, 322B, 323B and 324B are formed in outward opening shapes in order to divide side walls of the support 30B which are close thereto in a predetermined width. The width for dividing these side walls is smaller than lengths in a long direction of the second electrodes 231B, 232B, 233B and 234B. The plurality of opening portions 321B, 322B, 323B and 324B are formed in such shapes as to open the support 30B over a predetermined length from the close side walls toward a center as seen in the orthogonal direction to the third main surface. Lengths of the openings from the side walls toward the center are greater than lengths in a short direction of the second electrodes 231B, 232B, 233B and 234B.

A protective layer 40B is provided on the first electrode 221B, 222B, 223B and 224B side of the flat membrane type piezoelectric element 20B. The protective layer 40B is formed by the same material as the protective layer 40 described in the first embodiment. The protective layer 40B takes the same shape seen on a plane as the flat membrane type piezoelectric element 20B and the support 30B.

Figure 9A:
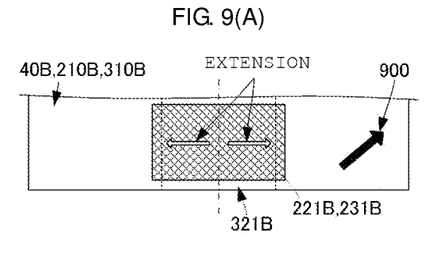
FIGS. 9(A) and 9(B) are views explaining a shape of the pressing force sensor in a push-in state and a concept of pressing force detection.
Figure 9B:
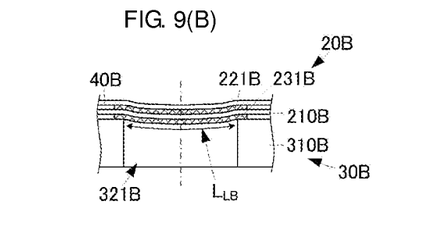

The pressing force sensor 10B having the structure detects pressing force which pushes the range of the opening portions 321B, 322B, 323B and 324B in from the protective layer 40B side. FIGS. 9(A) and 9(B) are views explaining a shape of the pressing force sensor in a push-in state and a concept of pressing force detection. FIG. 9(A) is an enlarged plan view showing the vicinity of the opening portion 321B and FIG. 9(B) is a side view showing an enlarged part illustrated in FIG. 9(A). The opening portion 321B will be described below. Referring to the other opening portions 322B, 323B and 324B, the pressing force can be detected by the same action.

As shown in FIGS. 9(A) and 9(B), when a surface of the protective layer 40B (a surface at an opposite side to the flat membrane type piezoelectric element 20B side), the piezoelectric sheet 210B is also displaced together with the protective layer 40B by the push-in.

In a region where the second electrode 231B (the first electrode 221B) of the piezoelectric sheet 210B (the flat membrane type piezoelectric element 20B) is formed, only the vicinity of ends in the long direction of the second electrode 231B is fixed to the support 30B. For this reason, a region between the both ends is opposed to the opening portion 321B and serves as a space portion. Accordingly, both ends in the short direction of the second electrode 231B are not fixed over an almost full length. A uniaxial stretching direction of the piezoelectric sheet 210B forms an angle of 45° with respect to long and short directions of a region opposed to the second electrode 231B in the opening portion 321B.

In a portion configured from the second electrode 231B, the first electrode 221B and the piezoelectric sheet 210B interposed therebetween in the flat membrane type piezoelectric element 20B, accordingly, only a displacement $L_{LB}$ is caused by distortion (extension) along the long direction of the second electrode 231B and the first electrode 221B and a displacement along the short direction is rarely caused by the push-in as shown in FIG. 9(B). Therefore, an electric charge generated by the displacement in the long direction is prevented from being offset by an electric charge generated by the displacement in the short direction. Consequently, higher detection voltage can be generated by the displacement. In other words, it is possible to generate the detection voltage by the displacement more efficiently.

Although the description has been given to the case in which the first electrode and the second electrode take the rectangular shapes (rectangles) seen on a plane, it is possible to obtain the same functions and effects with a square shape by the structure in which only the ends in one of the two orthogonal directions of the electrodes are fixed to the support as in the present embodiment.

In other words, it is possible to obtain the same functions and effects with a structure in which a difference is made in distortion caused by push-in in two orthogonal directions of a portion where an electrode is formed on a piezoelectric sheet as the structure according to the present invention. It is suitable that the uniaxial stretching direction of the piezoelectric sheet should form an angle of approximately 45° with respect to the two orthogonal directions.

Figure 10:
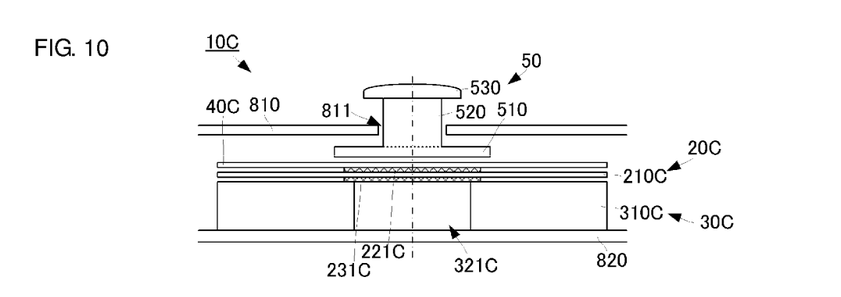
FIG. 10 is a partial enlarged view showing a side surface of a pressing force sensor according to a fourth embodiment of the present invention.

Next, a pressing force sensor according to a fourth embodiment will be described with reference to the drawings. FIG. 10 is a partial enlarged view showing a side surface of the pressing force sensor according to the fourth embodiment of the present invention.

A pressing force sensor 10C according to the present embodiment is obtained by further adding a push-in member 50 to the pressing force sensor 10B according to the third embodiment.

A flat membrane type piezoelectric element 20C is the same as the flat membrane type piezoelectric element 20B according to the third embodiment, a support 30C is the same as the support 30B according to the third embodiment, and a protective layer 40C is the same as the protective layer 40B according to the third embodiment. The protective layer 40C can be omitted.

A surface of the support 30C at an opposite side to the flat membrane type piezoelectric element 20C abuts on a base circuit board 820 of an operating device in which the pressing force sensor 10C is to be incorporated.

The push-in member 50 is provided on an opposite side of the flat membrane type piezoelectric element 20C at the protective layer 40C. The push-in member 50 includes a flat plate portion 510, a neck portion 520 and a head portion 530. The push-in member 50 is formed by a material having such flexibility that the flat plate portion 510 is curved by push-in. For example, the push-in member 50 is formed of rubber or the like.

The flat plate portion 510 takes such a shape that at least a length in long directions of a first electrode 221C and a second electrode 231C is greater than their lengths. In a state of no push-in from an outside, a surface of the flat plate portion 510 at the protective layer 40C side takes a flat shape.

The neck portion 520 is formed like a column having a smaller sectional area than an opening portion 321C. The flat plate portion 510 abuts on one of ends in a direction in which the column is stretched in the neck portion 520. Moreover, the head portion 530 abuts on the other end in the direction in which the column is stretched in the neck portion 520. The neck portion 520 has such a shape and hardness that deformation is caused by the push-in from the outside with difficulty.

The head portion 530 takes a shape of an almost flat plate having an operation surface in a predetermined area. It is preferable to properly set the area of the operation surface based on a size of a general operator's finger or the like, for example.

The push-in member 50 taking the shape is disposed in such a manner that the head portion 530 side is exposed from a through hole 811 provided on a housing 810 of the operating device to an outside in the middle of the neck portion 520.

Figure 11:
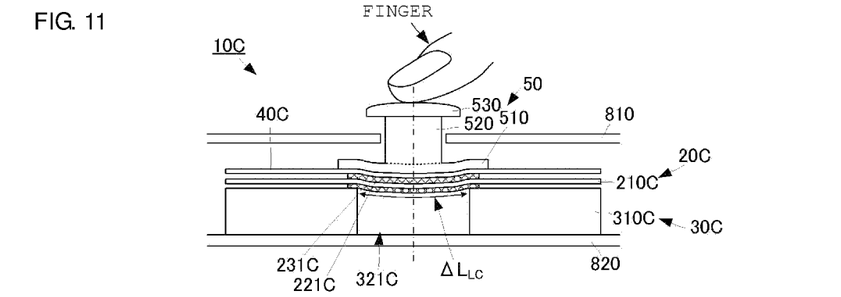
FIG. 11 is a partial enlarged view showing the side surface of the pressing force sensor in a state in which a push-in member is pushed in with a finger of an operator.

In the case in which operation input is carried out by using the push-in member 50, the flat membrane type piezoelectric element 20C is displaced as shown in FIG. 11 so that pressing force can be detected. FIG. 11 is a partial enlarged view showing a side surface of the pressing force sensor in which the push-in member is pushed in with the operator's finger.

As shown in FIG. 11, when the operator pushes the push-in member 50 in, the head portion 530 and the neck portion 520 are moved from the outside to the opening portion 321C side. When the end of the flat plate portion 510 abuts on the first main surface side of the flat membrane type piezoelectric element 20C, it is held by the support 310C through the flat membrane type piezoelectric element 20C. However, a central part of the flat plate portion 510 to which the neck portion 520 is connected is pushed into the opening portion 321C side with curving depending on an amount of push-in (pressing force). Consequently, a piezoelectric sheet 210C of the flat membrane type piezoelectric element 20C is also extended and distorted along the long direction so that a displacement $L_{LC}$ is generated. By detection voltage generated by the displacement $L_{LC}$, it is possible to detect the amount of push-in (pressing force).

With the structure according to the present embodiment, the neck portion 520 pushing the flat plate portion 510 in is provided within the range of the opening portion 321C. Even if any position of the head portion 530 in the push-in member 50 is pushed in, therefore, a portion of the piezoelectric sheet 210C which is opposed to the opening portion 321C is pushed in. Consequently, it is possible to reliably detect the push-in.

Figure 12:
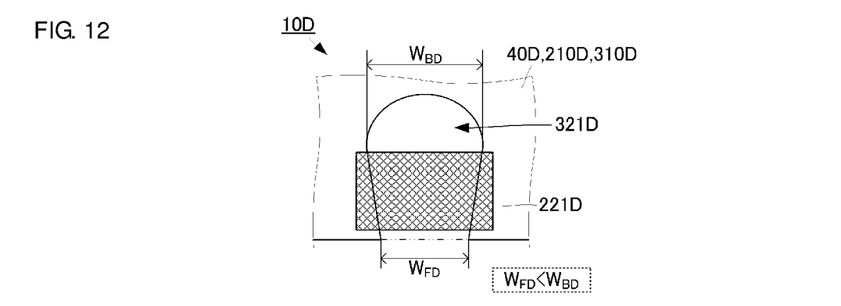
FIG. 12 is a partial enlarged view showing a pressing force sensor according to a fifth embodiment of the present invention.

Next, a pressing force sensor according to a fifth embodiment will be described with reference to the drawings. FIG. 12 is a partial enlarged view showing the pressing force sensor according to the fifth embodiment of the present invention. As compared with the pressing force sensor 10B according to the third embodiment, a pressing force sensor 10D according to the present embodiment takes a different shape of an opening portion and has the same other structures. FIG. 12 shows only an opening portion 321D which has the same structure as the other opening portions formed on a support 310D.

As shown in FIG. 12, the opening portion 321D takes such a shape that an opening width $W_{FD}$ on an end side of a body 310D of a support 30D is smaller than an opening width $W_{BD}$ on a central side ($W_{FD}<W_{BD}$). With the structure, similarly, it is possible to obtain the same functions and effects as in the third embodiment described above.

Figure 13:
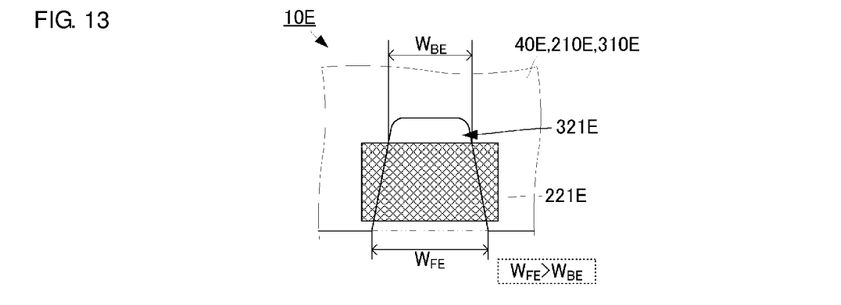
FIG. 13 is a partial enlarged view showing a pressing force sensor according to a sixth embodiment of the present invention.

Next, a pressing force sensor according to a sixth embodiment will be described with reference to the drawings. FIG. 13 is a partial enlarged view showing the pressing force sensor according to the sixth embodiment of the present invention. As compared with the pressing force sensor 10B according to the third embodiment, a pressing force sensor 10E according to the present embodiment takes a different shape of an opening portion and has the same other structures. FIG. 13 shows only an opening portion 321E which has the same structure as the other opening portions formed on a support 310E.

As shown in FIG. 13, an opening portion 321E takes such a shape that an opening width $W_{FE}$ on an end side of a body 310E of a support 30E is greater than an opening width $W_{BE}$ on a central side ($W_{FE}>W_{BE}$). With the structure, similarly, it is possible to obtain the same functions and effects as in the third embodiment described above.

Figure 14A:
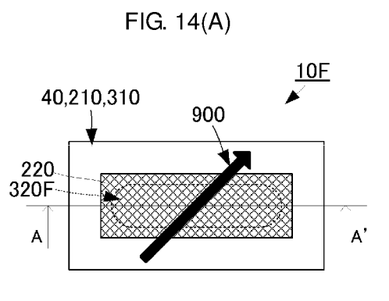
FIGS. 14(A) to 14(D) are a three-plan view showing a pressing force sensor and a sectional view taken along an A-A' surface according to a seventh embodiment of the present invention.
Figure 14B:
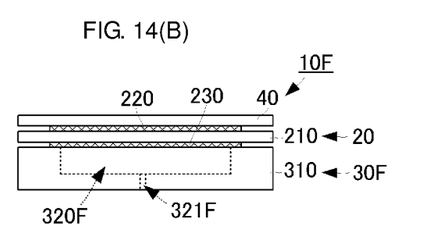
Figure 14C:
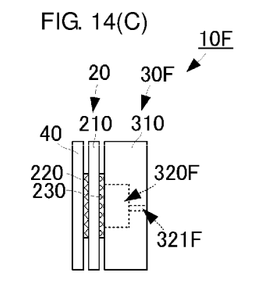
Figure 14D:
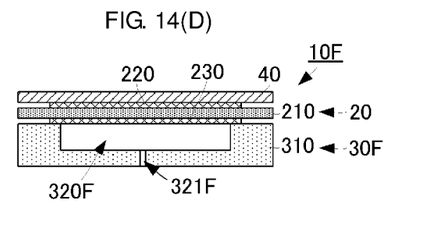

Next, a pressing force sensor according to a seventh embodiment will be described with reference to the drawings. FIG. 14(A) is a plan view showing the pressing force sensor according to the seventh embodiment of the present invention, FIG. 14(B) is a side view showing a long surface of the pressing force sensor, FIG. 14(C) is a side view showing a short surface of the pressing force sensor, and FIG. 14(D) is a sectional view taken along an A-A' surface.

A pressing force sensor 10F according to the present embodiment takes a shape of an opening portion 320F of a body 310F in a support 30F which is different from that of the opening portion 320 of the support 30 in the pressing force sensor 10 according to the first embodiment and has the same other structures. Accordingly, only different parts will be described.

The opening portion 320F is formed on the support 30F. The opening portion 320F is configured from a dent formed in a predetermined depth from a third main surface of the support 30F. An opening shape on the third main surface side of the opening portion 320F is the same as that of the opening portion 320 according to the first embodiment. A through hole 321F penetrating a body 310F is formed on a bottom face of the opening portion 320F. The through hole 321F serves to discharge air in the opening portion 320F to an outside when a flat membrane type piezoelectric element 20F is pushed into the opening portion 320F.

With the structure, similarly, it is possible to obtain the same functions and effects as in the first embodiment. A structure of the dent can also be applied to the respective opening portions 321 to 326 according to the second embodiment. Moreover, the structure can also be applied to the opening portion in each of the embodiments in and after the third embodiment.

Figure 15A:
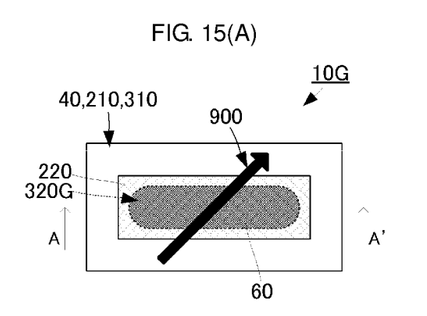
FIGS. 15(A) to 15(D) are a three-plan view showing a pressing force sensor and a sectional view taken along an A-A' surface according to an eighth embodiment of the present invention.
Figure 15B:
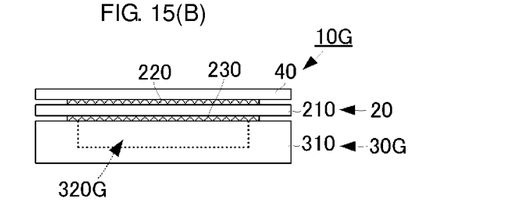
Figure 15C:
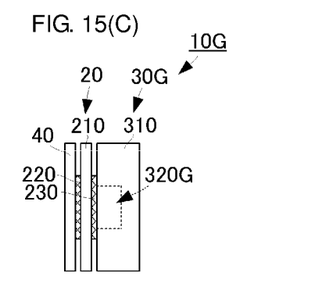
Figure 15D:
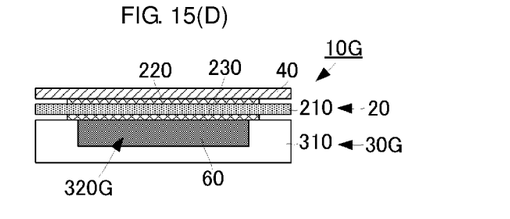

Next, a pressing force sensor according to an eighth embodiment will be described with reference to the drawings. FIG. 15(A) is a plan view showing the pressing force sensor according to the eighth embodiment of the present invention, FIG. 15(B) is a side view showing a long surface of the pressing force sensor, FIG. 15(C) is a side view showing a short surface of the pressing force sensor, and FIG. 15(D) is a sectional view taken along an A-A' surface.

A pressing force sensor 10G according to the present embodiment is obtained by further disposing an elastic member 60 on the pressing force sensor 10F according to the seventh embodiment, and the other structures are basically identical to those in the pressing force sensor 10F. Although the through hole for discharging air formed in the pressing force sensor 10F according to the seventh embodiment is not required as shown in FIG. 15 in the structure according to the present embodiment, it may be formed.

The elastic member 60 is disposed in an opening portion 320G of the pressing force sensor 10G. It is preferable to select a material which does not impede a displacement of a piezoelectric sheet 210G for the elastic member 60. If presence of press is to be simply detected, however, it is preferable that a Young's modulus of the elastic member 60 should be lower than that of the piezoelectric sheet 210G.

By this structure, it is possible to prevent the piezoelectric sheet 210G from being deformed more greatly than a desire by strong push-in. Thus, it is possible to avoid breakage of the piezoelectric sheet 210G.

Although the description has been given to the example in which the piezoelectric sheet containing polylactic acid is used, the structure can be applied to a piezoelectric sheet having a piezoelectric constant d14. Consequently, the same functions and effects can be obtained.

DESCRIPTION OF REFERENCE SYMBOLS 10, 10A, 10B, 10C, 10D, 10E, 10F, 10G: pressing force sensor
20, 20A, 20B, 20C: flat membrane type piezoelectric element
210, 210A, 210B, 210C: piezoelectric sheet
220, 221, 222, 223, 224, 225, 226, 221B, 222B, 223B, 224B, 221C: first electrode
230, 231, 232, 233, 234, 235, 236, 231B, 232B, 233B, 234B, 231C: second electrode
30, 30A, 30B, 30C, 30D, 30E, 30F, 30G: support
310, 310A, 310B, 310C, 310D, 310E, 310F, 310G: body
320, 321, 322, 323, 324, 325, 326, 321B, 322B, 323B, 324B, 321C, 321D, 320F: opening portion
321F: through hole
40, 40A, 40B, 40C: protective layer
50: push-in member
60: elastic member
510: flat plate portion
520: neck portion
530: head portion
810: housing
811: through hole
820: base circuit board

The invention claimed is:

1. A pressing force sensor comprising:
a piezoelectric sheet having a first main surface and a second main surface which are opposed to each other;
a first electrode on the first main surface;
a second electrode on the second main surface; and
a support abutting the second main surface of the piezoelectric sheet,
wherein the support defines a space sized so as to allow deformation of at least a part of the second electrode into the space, and
the piezoelectric sheet and the support are disposed such that distortion caused by an external force applied to the piezoelectric sheet over the space differs in two directions which are orthogonal to each other.

2. The pressing force sensor according to claim 1, wherein the space has different lengths in the two directions which are orthogonal to each other.

3. The pressing force sensor according to claim 1, wherein the piezoelectric sheet contains polylactic acid.

4. The pressing force sensor according to claim 3, wherein the piezoelectric sheet has been stretched in at least a uniaxial direction that is different from the two directions which are orthogonal to each other.

5. The pressing force sensor according to claim 4, wherein the uniaxial direction in which the piezoelectric sheet has been stretched forms an angle of approximately 45° with respect to the two directions which are orthogonal to each other.

6. The pressing force sensor according to claim 1, wherein the piezoelectric sheet is fixed to only opposed ends in a long direction of the space of the support.

7. The pressing force sensor according to claim 1, wherein the space is a dent having a predetermined depth from a surface of the support.

8. The pressing force sensor according to claim 7, further comprising an elastic member disposed in the dent.

9. The pressing force sensor according to claim 7, further comprising a through hole extending from the dent and through the support.

10. The pressing force sensor according to claim 1, wherein the space is opened on an end side surface of the support.

11. The pressing force sensor according to claim 10, wherein a first width of the space at the end side surface of the support is smaller than a second width of the space proximal to a center of the support.

12. The pressing force sensor according to claim 10, wherein a first width of the space at the end side surface of the support is larger than a second width of the space proximal to a center of the support.

13. The pressing force sensor according to claim 1, wherein the pressing force sensor includes plural sets of the first electrodes, the second electrodes and the spaces.

14. The pressing force sensor according to claim 13, wherein the plural spaces are each opened on a respective end side surface of the support.

15. The pressing force sensor according to claim 1, further comprising a protective layer on the first main surface side of the piezoelectric sheet.

16. The pressing force sensor according to claim 15, wherein the protective layer is an insulating material having a lower Young's modulus than the piezoelectric sheet.

17. The pressing force sensor according to claim 1, further comprising a push-in member adjacent the first main surface side of the piezoelectric sheet and configured to push at least a portion of the piezoelectric sheet opposed to the space.

18. The pressing force sensor according to claim 1, wherein materials of the first electrode and the second electrode are selected from the group consisting of an organic electrode containing ITO, ZnO and polythiophene as main components, an organic electrode containing polyaniline as a main component, a silver nanowire electrode and a carbon nanotube electrode.

19. The pressing force sensor according to claim 1, wherein a Young's modulus of the support is higher than that of the piezoelectric sheet.

20. The pressing force sensor according to claim 1, wherein the piezoelectric sheet is planar and the external force applied to the piezoelectric sheet over the space is applied in a direction perpendicular to the plane of the piezoelectric sheet.

* * * * *